United States Patent [19]
Glover

[11] Patent Number: 5,946,211
[45] Date of Patent: Aug. 31, 1999

[54] METHOD FOR MANUFACTURING A CIRCUIT ON A CIRCUIT SUBSTRATE

[75] Inventor: Douglas Wade Glover, Dauphin, Pa.

[73] Assignee: The Whitaker Corporation, Wilmington, Del.

[21] Appl. No.: 08/810,461

[22] Filed: Feb. 28, 1997

[51] Int. Cl.⁶ .............................. G06F 19/00; G06G 7/66
[52] U.S. Cl. ................ 364/468.03; 364/578; 364/468.28
[58] Field of Search ...................................... 364/488, 489, 364/490, 578, 468.03

[56] References Cited

U.S. PATENT DOCUMENTS

| | | | |
|---|---|---|---|
| 5,025,402 | 6/1991 | Winkelstein | 364/578 |
| 5,081,602 | 1/1992 | Glover | 364/578 |
| 5,379,231 | 1/1995 | Pillage et al. | 364/488 |
| 5,588,142 | 12/1996 | Sharrit | 395/500 |
| 5,694,344 | 12/1997 | Yip et al. | 364/578 |

OTHER PUBLICATIONS

PCT International Search Report; International application No.: PCT/US98/03548, International filing date Feb. 24, 1998.

AMPredictor Signal Integrity Analyzer; 3 Pages.

Mega–Software; "HSPICE User's Manual—Elements and Models"; 11 pages.

PCT International Application No.: PCT/US93/05186, International Publication No.: WO93/24896, Filing Date: Jun. 1, 1993.

Patent Abstract of Japan, Title: Method for Deriving Equivalent Circuit of Wiring. Application date Feb. 24, 1994, Application No. 06025831; Applicant: NEC Corp., Inventor: Takahashi Sojl.

IEEE Transactions on Computer–Aided Design, vol. II, No. 7, Jul. 1992. Selection of Lumped Element Models for Coupled Lossy Transmission Lines. Tom Dhaene and Daniel De Zutter.

Abstract: Simulating Nonuniform Lossy Lines with Frequency Dependent Parameters by the Method of Characteristics. Publication date May 30, 1994, Ali El–Zein IBM Corp, M. Haque, S. Chowdhury Motorola Inc.

PCT International Search Report. International applicationno.: PCT/US98/03548, International filing date: Feb. 24, 1998.

Primary Examiner—Albert DeCady
Assistant Examiner—Shelly A Chase
Attorney, Agent, or Firm—June B Schuette

[57] ABSTRACT

A frequency dependent lossy line subcircuit element has a first port (100), a second port (101), and a reference point (102). The lossy line element is configured to represent circuit performance over a band of frequencies. The lossy line element is modeled as a subcircuit comprising a parallel combination network of resistors (11–14), each with an inductor (1–4) in series disposed between the first port (100) and an internal node (103). Inductors (1–4) are proportioned in value relative to each other so as to control the magnitude of the simulated current flow through resistors (11–14) as a function of frequency content of an excitation signal appearing at the first port (100). The subcircuit, therefore, models frequency dependent attenuation for each frequency included in the range. A lossless transmission element (35) is further included in the frequency dependent lossy line subcircuit interposed between the internal node (103) and the second port (101) to represent the lossy line section delay and characteristic impedance of the transmission line.

16 Claims, 9 Drawing Sheets

Frequency Dependent Lossy Line Model

Base Data

50 — 45.093 <— Co, pf/ft
51 — 112.733 <— Lo, nh/ft
52 — 2.255 <— Tpd, ns/ft
      50 <— Zo

Trace Physicals

53 — 0.0100 <— Trace Width, Inches
54 — 0.0007 <— Trace Thickness, Inches

|  | R, ohms | L, nh | C, pf | Tpd, ps |
|---|---|---|---|---|
| Per Meter | 3.818 | 369.86 | 147.94 | 7398 |
| Per Inch | 0.097 | 9.39 | 3.76 | 188 |

At Length, Inches       63a      67       68

| Length | R, ohms | L, nh | C, pf | Tpd, ps |
|---|---|---|---|---|
| 0.100 | 0.0097 | 0.939 | 0.376 | 19 |
| 0.200 | 0.0194 | 1.879 | 0.752 | 38 |
| 0.250 | 0.0242 | 2.349 | 0.939 | 47 |
| 0.500 | 0.048 | 4.697 | 1.879 | 94 |
| 0.000 | 0.000 | 0.000 | 0.000 | 0 |
| 0.000 | 0.000 | 0.000 | 0.000 | 0 |
| 0.000 | 0.000 | 0.000 | 0.000 | 0 |
| 0.000 | 0.000 | 0.000 | 0.000 | 0 |
| 0.000 | 0.000 | 0.000 | 0.000 | 0 |

55 ↗ (arrow to 0.500 row)

Fig. 3

Trace Physicals

53 —— 0.0100 <— Trace Width, Inches
54 —— 0.0007 <— Trace Thickness, Inches

|  | DC | F1 (58) | F3 (58) | F5 (58) |
|---|---|---|---|---|
| Freq. |  | 5.00E+08 | 1.50E+09 | 2.50E+09 |
| Skin Depth (59) |  | 1.16E-04 | 6.71E-05 | 5.20E+05 |
| Base Area (60) |  | 7.00E-06 | 7.00R-06 | 7.00E-06 |
| Lost Area (61) |  | 4.57E-06 | 5.58E-06 | 5.90E-06 |
| Net Area (62) |  | 2.43E-06 | 1.42E-06 | 1.10E-06 |
| Per Meter |  | 3.818 | 21.957 | 37.677 | 48.502 |
| Per Inch |  | 0.097 | 0.558 | 0.957 | 1.232 |

At Length, Inches

| Length | | 63a | | | 63 |
|---|---|---|---|---|---|
| 0.100 | 0.0097 | 0.0558 | 0.0957 | 0.1232 |
| 0.200 | 0.0194 | 0.1115 | 0.1914 | 0.2464 |
| 0.250 | 0.0242 | 0.1394 | 0.2392 | 0.3080 |
| 0.500 | 0.048 | 0.2789 | 0.4785 | 0.6160 |
| 1.000 | 0.097 | 0.5577 | 0.9570 | 1.2319 |
| 5.000 | 0.485 | 2.7885 | 4.7850 | 6.1597 |
| 0.000 | 0.000 | 0.000 | 0.000 | 0.0000 |
| 0.000 | 0.000 | 0.000 | 0.000 | 0.0000 |
| 0.000 | 0.000 | 0.000 | 0.000 | 0.0000 |

(55)

AC Resistance of Trace is Doubled to Account for the Resistive Loss in the Return Planes

Parameter Calculation for Frequency Dependant Lossy Line Model
0.250 Section  10mil 1/2 oz 50 ohm Line  Trial → 0.0020  4.000  5.000

|  |  | Sect.Valu. | Calc.Freq. |  | L.Ratios | R.Ratios |  |
|---|---|---|---|---|---|---|---|
| a) → 2.350E-09 | L | 2.349E-09 | 2.50E+90 | F5 | 0.0020 | 100.000 | F5 |
|  | C | 9.390E-13 | 1.50E+90 | F3 | 0.0100 | 20.000 | F3 |
|  | Z | 50.0 | 5.00E+08 | F1 | 0.0500 | 4.000 | F1 |
|  | T | 4.696E-11 | 0.00E+00 | DC | 0.2500 |  |  |

| L.f5 | 4.692E-12 |  | Zx | R.f5 |  | R+Zx | IE | PE |
|---|---|---|---|---|---|---|---|---|
| L.f3 | 2.346E-11 |  | 0.000 | R.f3 | Base | 3.1702 | 0.315 | 0.3154 |
| L.f1 | 1.173E-10 |  | 0.000 | R.f1 |  | 0.6340 | 1.577 | 1.5772 |
| L.dc | 5.866E-14 |  | 0.000 | R.dc |  | 0.1268 | 7.886 | 7.8859 |
| L.base | 2.346E-09 |  | 0.000 |  |  | 0.0317 | 31.544 | 31.5438 |

|  |  |  |  | Re.dc | b) → |  | It | Pt |
|---|---|---|---|---|---|---|---|---|
|  |  |  |  | 0.0242 |  |  | 41.3223 | 41.3223 |
|  |  |  |  | Re.ac | c) → |  |  |  |
|  |  |  | R.tc | 0.0242 |  |  |  |  |
| C.f5 | 1.876E-15 |  | 3.55E+04 | RR |  |  |  |  |
| C.f3 | 9.379E-15 |  | 1.18E+04 | 0.3080 |  |  | F5 | 2.5g |
| C.f1 | 4.689E-14 |  | 7.11E+03 | 0.2392 |  |  | F3 | 1.5g |
| C.base | 9.379E-13 |  |  | 0.1394 |  |  | F1 | 500m |
|  |  |  |  | 0.0242 |  |  | DC |  |

"T" Line
Z0  50.0
TD  4.691E-11

Fig. 7

Parameter Calculation for Frequency Dependant Lossy Line Model

0.250 Section 10mil 1/2 oz 50 ohm Line

| | Sect.Valu. | | Trial | 0.0020 | 4.000 | 5.000 |
|---|---|---|---|---|---|---|
| a) → 2.350E-09 | L | 2.349E-09 | | L.Ratios | R.Ratios | |
| | C | 9.390E-13 | F5 | 0.0020 | 135.938 | F5 |
| | Z | 50.0 | F3 | 0.0111 | 24.540 | F3 |
| | T | 4.696E-11 | F1 | 0.0614 | 4.430 | F1 |
| | | | DC | 0.3400 | | 5.539 |

| | Calc.Freq. | | | | | |
|---|---|---|---|---|---|---|
| L.f5 | 4.692E-12 | 2.50E+90 | R.f5 | R+Zx | IE | PE |
| L.f3 | 2.599E-11 | 1.50E+90 | R.f3 | 4.0253 | 0.238 | 0.2370 |
| L.f1 | 1.440E-10 | 5.00E+08 | R.f1 | 0.8381 | 1.193 | 1.0769 |
| L.dc | 7.977E-10 | | R.dc | 0.5889 | 1.698 | 0.3937 |
| L.base | 2.346E-09 | 5.00E+08 | | 2.5367 | 0.394 | 0.0048 |

| | Base | | | | |
|---|---|---|---|---|---|
| C.f5 | 1.876E-15 | Re.dc | 0.0242 | It | Pt |
| C.f3 | 1.039E-14 | Re.ac | 0.1380 | 3.5231 | 1.7123 |
| C.f1 | 5.756E-14 | | | | |
| C.base | 9.379E-13 | RR | R.tc | 2.5g | |
| | | 0.3080 | 3.55E+04 | 1.5g | |
| "T" Line | | 0.2392 | 1.07E+04 | 500m | |
| ZO | 50.0 | 0.1394 | 5.79E+03 | | |
| TD | 4.691E-11 | 0.0242 | | | |

| Parameter Calculation for Frequency Dependant Lossy Line Model | | 0.250 | Section 10mil | 1/2 oz | 50 ohm Line | |
|---|---|---|---|---|---|---|
| | | Sect.Valu. | Trial → | 0.0020 | 4.000 | 5.000 |
| a) → | L | 2.349E-09 | | L.Ratios | R.Ratios | |
| | C | 9.390E-13 | F5 | 0.0018 | 135.938 | F5 |
| | Z | 50.0 | F3 | 0.0101 | 24.540 | F3 |
| | T | 4.696E-11 | F1 | 0.0557 | 4.430 | F1 |
| | | | DC | 0.3086 | | 5.539 |
| | | Calc.Freq. | | | | |
| L.f5 | 4.259E-12 | 2.50E+90 | Zx | R+Zx | IE | PE |
| L.f3 | 2.359E-11 | 1.50E+90 | 0.067 | 4.2575 | 0.235 | 0.2312 |
| L.f1 | 1.307E-10 | 5.00E+08 | 0.371 | 1.1271 | 0.887 | 0.5955 |
| L.dc | 7.240E-10 | 2.50E+09 | 2.053 | 2.1896 | 0.457 | 0.0285 |
| L.base | 2.346E-09 | | 11.373 | 11.4034 | 0.088 | 0.0002 |
| | | | | | It | Pt |
| | | | | | 1.6665 | 0.8554 |
| | | R.f5 | R.tc | Base | | |
| | | R.f3 | 3.92E+04 | Re.dc | | |
| | | R.f1 | 1.18E+04 | 0.0242 | | |
| | | R.dc | 6.38E+03 | Re.ac | | |
| C.f5 | 1.703E-15 | | | 0.1380 | | |
| C.f3 | 9.431E-15 | | | RR | | |
| C.f1 | 5.225E-14 | | | 0.3080 | F5 | 2.5g |
| C.base | 9.379E-13 | | | 0.2392 | F3 | 1.5g |
| | | | | 0.1394 | F1 | 500m |
| | | | | 0.0242 | DC | |
| T Line | | | | | | |
| Z0 | 50.0 | | | | | |
| TD | 4.691E-11 | | | | | |

```
* FDLL MODEL
* 50 ohm trace
* 10 mil 1/2 oz stripline
* 0.0250 section
* for 500 mhz fundamental
*****************************      —102           —20
.SUBCKT  TS10      1—  3 — 4 —
******************IN**ref*OUT
                                   —101
* dc
                                   —100
RS11  01  11  0.308 —
LS11  15  7.240E-10 — 11
                          — 1
* 500 mhz
RS12  01  12  0.1366 — 12
LS12  12  15  1.307E-10 — 2
CC12  12  121  5.225E-14 — 22
RP12  121  03  6.38E3 — 32
* 1.5 ghz
RS13  01  13  0.7565 — 13
LS13  13  15  2.359E-11 — 3
CC13  13  131  91437E-15 — 23
RP13  131  03  1.18E4 — 33
* 2.5 ghz
RS14  01  14  4.1906 — 14
LS14  14  15  4.259E-12 — 4
CC14  14  141  1.703E-15 — 24
RP14  141  03  3.92E4 — 34
                                                    77
* "T" line
TL15  15  03  04  03  ZO=50.0  TD=4.691E-11
*********                          — 56
.ENDS TS10
```

Fig. 9

METHOD FOR MANUFACTURING A CIRCUIT ON A CIRCUIT SUBSTRATE

FIELD OF THE INVENTION

The present invention is related to fabrication of a circuit on a circuit substrate and more particularly to a method for predictive modeling of circuit performance to increase the likelihood of operational performance according to desired parameters.

BACKGROUND OF THE INVENTION

Software driven predictive circuit modeling such as Simulation Program with Integrated Circuit Emphasis (SPICE) is known. SPICE software is typically used as an aid by circuit designers to simulate the operation of a given circuit. If the simulation indicates that the circuit exhibits suboptimal performance, then the step of circuit fabrication is not performed. By not building and testing a circuit on a circuit substrate, a circuit designer can save a substantial amount of time and money pursuing an improved design with a higher likelihood of desired performance. Predictive modeling permits an iterative circuit design process as the designer optimizes the performance of the circuit according to desired performance parameters. Multiple simulations using slight component value variations and/or designs can aid a circuit designer's understanding of how manufacturing tolerances of component values affect performance of the circuit. Predictive modeling can also be very powerful as an aid to simultaneous engineering where different parts of a system are designed and built concurrently. Predictive modeling can be used to increase the likelihood that the entire system will perform as intended. Concurrent engineering and manufacturing significantly reduces time to market and reduces the high costs of scrap, rework and redesign.

An accurate predictive model is of significantly greater value than one that is less accurate. The better the model can simulate the performance of the fabricated circuit, the higher the confidence level of decisions made based on the simulated performance. In prior art predictive models, the electrical performance of circuit interconnects including cables, wires, traces and stripline is largely ignored. Where logic switching time is long relative to the transmission time through the interconnect, the idealized simulation of instantaneous and complete transmission is an adequate assumption. As frequency increases, however, the instantaneous transmission assumption is not adequate. At higher frequencies, an actual transmission line exhibits not only propagation delay but also frequency dependent attenuation and dispersion largely due to skin effect.

There are known lossy transmission line model elements which are modeled as a series circuit of multiple lumped filter sections. One such lossy transmission line element is known as the U model and is part of HSPICE® software version H92 available from Meta-Software Inc. of Campbel, Calif. In the U-model, the lumped element values are calculated given certain geometric and structural parameters for known transmission structures. From the structural parameters, the U-model calculates values for a series combination circuit comprising a resistor and inductor in series with a capacitor in parallel to a reference point. The U-model also includes a conductance in parallel with the capacitor and may include two or more stages of the combination circuit. Typically, these models include a dc resistance and an elevated resistance to simulate attenuation at a higher frequency. In the case of digital signaling, however, there is a broadband of frequencies of interest that comprise an excitation signal having a given rise time. Accordingly, a single resistance parameter to model higher frequency attenuation results in an incomplete model. Disadvantageously, the results of this simplified lossy line may be inadequate in that it does not accurately simulate broadband transmission line performance. There is a need, therefore, for a frequency dependent lossy transmission line model element for use in circuit simulation systems that can more accurately predict transmission line performance over a broad range of frequencies improving digital signaling predictive performance. An improved circuit simulation system when used in conjunction with a circuit fabrication process can significantly reduce the time and cost of bringing an electronic product to market having desired operational performance.

SUMMARY OF THE INVENTION

It is an object of the present invention to provide an improved method of designing and fabricating a circuit on a circuit substrate.

It is a further object of the present invention to provide a more accurate predictive model for high frequency digital circuits as an aid to determine operational performance of a fabricated circuit.

It is a further object of the present invention to improve a predictive model for transmission line structures where the frequencies of interest are high enough to have significant skin effect losses while also adequately simulating direct current (DC) and interim frequency performance.

A method for fabricating a circuit on a circuit substrate, the circuit substrate having circuit components interconnected by conductive elements, the method comprising the steps of providing a computer system for modeling performance of the circuit using a computer model. The circuit comprises the multiple circuit components interconnected by the conductive elements. The method further comprises selecting a set of application specific parameters for the computer model and executing the computer model to simulate performance of the circuit in response to an excitation signal. The computer model comprises a subcircuit to simulate at least one of the conductive elements. The subcircuit comprises a dc resistance in series with a dc inductance, in parallel with a first frequency resistor in series with a first frequency inductor. The first frequency resistor and inductor series combination has a path to a reference point through a first frequency shunt capacitor. The method further comprises comparing the simulation results against operational performance targets and modifying the set of application specific parameters and repeating the step of executing the computer model, if the simulated results are not optimal. The method further comprises fabricating the circuit on the circuit substrate comprising the multiple circuit components interconnected by the conductive elements disposed on the circuit substrate according to an optimal one of said application specific parameter sets.

It is an advantage that a method according to the teachings of the present invention reduces the time and cost of designing and fabricating a circuit on a circuit substrate according to desired operational characteristics.

It is a further advantage that a method according to the teachings of the present invention provides a more accurate simulation of a frequency dependent lossy transmission line structure.

BRIEF DESCRIPTION OF THE DRAWINGS

Embodiments of the invention will now be described by way of example with reference to the accompanying drawings in which:

FIG. 3 illustrates a spreadsheet used to calculate the total resistance, inductance, capacitance and propagation delay for different section lengths of a transmission line.

FIG. 4 illustrates a spreadsheet used to calculate an effective resistance for frequencies of interest at each of the different section lengths of the transmission line to be modeled.

FIG. 5 illustrates a first iteration of the circuit element solver.

FIG. 7 illustrates a third iteration of the circuit element solver.

FIG. 8 illustrates a fourth iteration of the circuit element solver.

FIG. 9 illustrates a transmission line subcircuit net list according to a preferred embodiment of the teachings of the present invention.

DESCRIPTION OF THE PREFERRED EMBODIMENT

Figure 1:
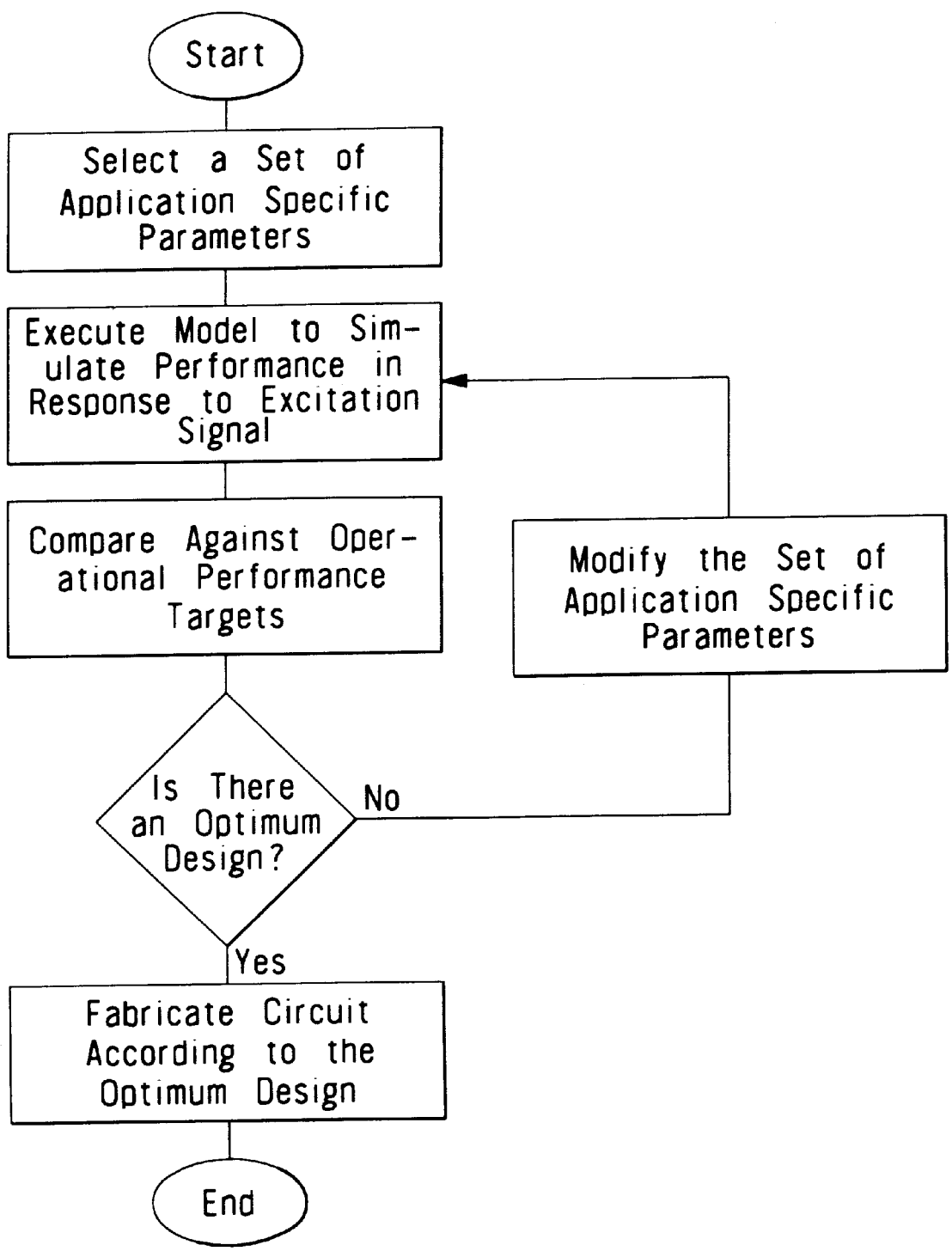
FIG. 1 shows a flowchart of a circuit fabrication process according to the teachings of the present invention.
Figure 2:
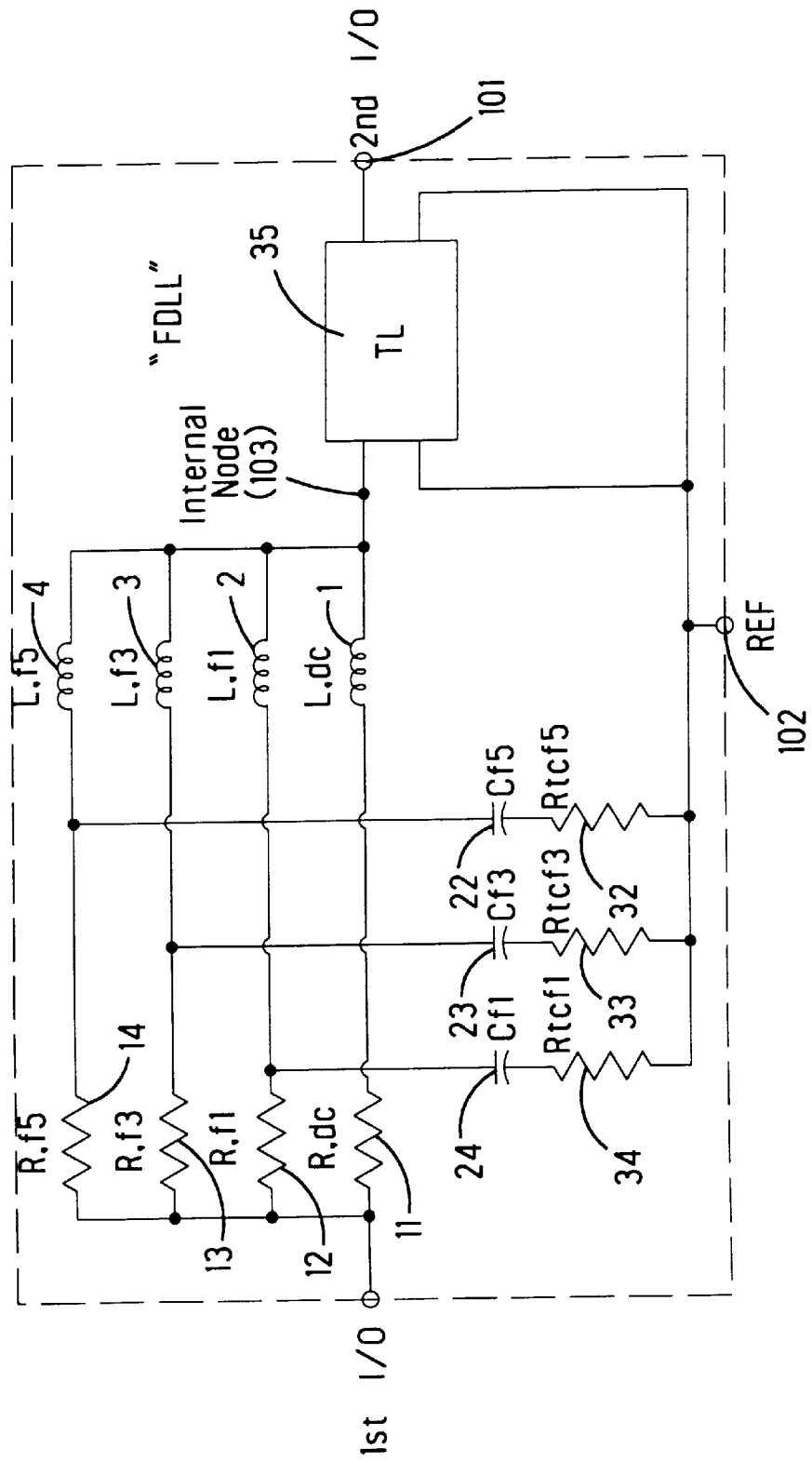
FIG. 2 illustrates a transmission line subcircuit schematic according to the teachings of the present invention.

With specific reference to FIG. 1 of the drawings, there is shown a flowchart of a circuit design and fabrication process according to the teachings of the present invention. In it, a computer executing modeling software is used as an aid to predict the performance of a circuit. A circuit designer creates a code or netlist as a datafile to describe the devices and elements that comprise a circuit. The netlist includes information regarding the values of the devices and elements comprising the circuit and the interconnection configuration. The netlist format is conventional and is dependent upon the modeling software. The netlist may be used to electrically describe the circuit on a circuit substrate such as a printed wiring board, wired cable, multichip module, and/or integrated circuit (IC) package. The teachings of the present invention are equally applicable to all of these structures.

A frequency dependent lossy line subcircuit element according to the teachings of the present invention has a first port (100), a second port (101), and reference point (102). In a preferred embodiment, the lossy line element is configured to represent circuit performance over a band of frequencies by making provision for a fixed number of specific frequencies over the range including: a DC signal, a fundamental, and the third and fifth harmonics of the fundamental. This configuration is particularly well suited for digital excitation signals due to the harmonic content thereof. The lossy line element is modeled as a subcircuit comprising a parallel combination network of resistors, each with an inductor in series disposed between the first port (100) and an internal node (103). In a preferred embodiment, there are four resistor/inductor series circuits in parallel with each other. Each resistor/inductor series circuit is configured to model the losses at each of four frequencies; DC and first, second and third frequencies. In the present example the four frequencies represent DC, a 500 MHz fundamental ($f_1$), the 1.5 GHz third ($f_3$) and 2.5 GHz fifth ($f_5$) harmonics. Inductors $L_{dc}$ (1), first inductor $L_{f1}$ (2), second inductor $L_{f3}$ (3) and third inductor $L_{f5}$ (4) are proportioned in value relative to each other so as to control the magnitude of the simulated current flow there through as a function of frequency content of an excitation signal appearing at the first port (100). Each inductor value (1–4) is chosen such that the inductive parallel combination is less than 1% of the total frequency inductance for the line frequency segment. Resistors $R_{dc}$ (11), first resistor $R_{f1}$ (12), second resistor $R_{f3}$ (13), and third resistor $R_{f5}$ (14) are initially selected such that the frequency resistive loss of the parallel combination together with the current flow controlled by the respective inductors is close to that of an actual transmission line over the frequency band of interest. The frequency dependent lossy line subcircuit further comprises first, second and third shunt capacitors; $C_{f1}$ (22), $C_{f3}$ (23), and $C_{f5}$ (24), respectively, each interposed between a respective series resistor/inductor combination and the reference point 102. The capacitor values are chosen to match the overall subcircuit combination to a desired interconnection characteristic impedance, $Z_0$. Each capacitor has a respective first time constant resister $R_{tcf1}$, (32), second time constant resistor $R_{tcf3}$ (33), and third time constant resistor $R_{tcf5}$ (34) in series with it. The resistive value of each time constant resistor (32–34) is selected to provide three RC time constants at each of the three frequencies; the fundamental, the third and the fifth harmonics.

The subcircuit heretofore described, models frequency dependent attenuation for each of the DC, fundamental, third and fifth harmonic signal components and some frequency dependent delay. A lossless transmission line element (35) is further included in the frequency dependent lossy line subcircuit and is interposed between the internal node 103 and the second port 101. A delay associated with the lossless transmission line element (35) accounts for the balance of the lossy line section delay and is assigned an impedance to match the lossy line section impedance.

Selection of the appropriate component values begins with determination of the frequency band of interest. Value selection is shown herein by example for a 500 MHz digital excitation signal having a 150 psec rise time. The frequency spectrum of the digital signal may be approximated by a DC component, a 500 MHz fundamental, a 1.5 GHz third harmonic, and a 2.5 GHz fifth harmonic. A 150 psec rise time requires a minimum 2.33 GHz bandwidth (BW) based on the approximation:

$$BW = 0.35/\text{risetime}.$$

As the 2.33 GHz is less than the highest frequency component of 2.5 GHz, the four series resistor/inductor parallel configuration can reasonably approximate actual bandwidth. The resistance for each series resistor/inductor circuit is calculated based upon the assumption that at each frequency, electrical conduction is confined to a single skin depth and that the charge distribution is uniform over the conductor periphery.

Initial section impedances of the interconnection to be modeled are estimated using capacitance per unit length, inductance per unit length, and propagation delay per unit length for the type of conductor to be used as well as physical parameters including trace thickness and trace width for a number of trace section lengths. Trace section lengths (55) are determined from those length values that comprise an integral multiple of the total section length for the trace being modeled. The trace data (50, 51, 52,) the physical trace values (53, 54) and the section lengths (55) are data input for further calculation. As an example and with specific reference to FIG. 3 of the drawings, appropriate values of the lumped element used in the subcircuit may be calculated using a conventional spreadsheet program such as EXCEL® spreadsheet application software. A copper trace of one half ounce copper having a trace width of 0.01 inches (53) and a trace thickness of 0.0007 inches (54) is known to exhibit transmission parameters of 45.093 pf per foot of capacitance, 112.733 nH per foot of inductance, and 2.255 nsec per foot of propagation delay. The transmission parameters are input into the appropriate cells (50–54). Using a set of four different section lengths (55), the section resistance, section inductance, section capacitance, and section propagation delay is calculated by conventional multiplication as shown in FIG. 3 of the drawings. Based upon the calculations, a section length (55) that yields a propagation delay less than half of the rise time which in the present example is 0.25 inches is selected. Smaller section lengths result in accurate results and may be used. It has been found, however, that there is a significant degradation in model processing speed without a significant improvement in result accuracy. The corresponding section length and section resistance, inductance and capacitance is used as an overall impedance target in a later calculation to be described hereinafter.

The total section resistance at each frequency and for each section length for the same type of trace is then calculated. These calculations are preferably made using a different EXCEL® spreadsheet calculator as shown in FIG. 4 of the drawings. The fundamental, third and fifth harmonic frequencies 58 are data input into the spreadsheet calculator. The skin depth 59 in meters is calculated for the fundamental, third and fifth harmonics using the relationship:

$$\delta = 500 \cdot \sqrt{\rho/f}$$

where $\rho$ is resistivity of the trace conductor in ohm-meters and f is frequency in Hertz (Hz). As an appropriate simplification, it is assumed that all conduction occurs within a single skin depth. Therefore, the net area (62) within which the charge is carried may be calculated from the difference between the total cross sectional area of the trace, or base area (60), less the lost area (61). The total cross sectional area of the trace is the trace width (53) multiplied by the trace thickness (54). The cross sectional area of the trace that carries no charge, or lost area (61), is the trace width (53) less two skin depths (59) multiplied by the trace thickness (54) less two skin depths (59). The resulting difference is the net area (62) that carries charge at each frequency. Based upon the section length (55) and the net area (62), the resistance at each frequency is calculated using the relationship:

$$R_{section}(63) = \frac{\rho \cdot (\text{section length 55})}{(\text{net area 62})}$$

The result of these calculations is the effective section resistance (63) at each frequency component of interest including DC, the fundamental, as well as the third and fifth harmonics of the fundamental.

A third Excel® spreadsheet calculator shown in FIG. 5 of the drawings, iteratively solves for values of the circuit elements that comprise the frequency dependent lossy line subcircuit according to the teachings of the present invention. These calculations are performed and iteratively solved in four separate refinements. Initially, the spreadsheet establishes a baseline or initial approximation for the DC subcircuit parameters. Data input to the first iteration of the spreadsheet calculator comprises the calculation frequency (57), and the effective resistances (63) for each frequency. The effective resistances (63) represent the resistive impedance component for the frequency dependent lossy line being modeled at each frequency. Also input into the first iteration is the total section inductance (67) and total section capacitance (68) as calculated for the appropriate section length (See FIG. 3 of the drawings). The total section inductance (67) and total section capacitance (68) are used as values for baseline inductance (69) and baseline capacitance (70).

In a preferred embodiment, values input into the spreadsheet for the first refinement include a calculated frequency of 0 Hz (57) and the effective resistances (63) 0.0242 ohms, 0.1394 ohms, 0.2392 ohms and 0.308 ohms as calculated for the appropriate section length (55) for each frequency respectively (See FIG. 4). The total section inductance (67) is 2.346 nH and the total section capacitance (68) is 0.9379 pF. Also input into the spreadsheet calculator is ratio constant (64), inductance ratio (65), and resistance ratio (66) which in a preferred embodiment are 5.0, 0.0020 and 4.0 respectively. The ratio constant (64) and the inductance and resistance ratios (65,66) are appropriate for all known models and are empirically derived. The value of the resistance ratio (66) is used as an initial first frequency resistance factor (66a). The first frequency resistance factor (66a) is multiplied by the ratio constant (64) to arrive at an initial second frequency resistance factor (66b), and the second frequency resistance (66b) is multiplied by the ratio constant (64) to arrive at an initial third resistance factor (66c). The inductance factors (65) are similarly calculated. The value of the inductance ratio (65) is used as the initial third frequency inductance factor which is multiplied by the ratio constant (64) to arrive at the initial second frequency inductance factor. The initial second frequency inductance factor is multiplied by the ratio constant (64) to arrive at the initial first frequency inductance factor which is multiplied by the ratio constant (64) to arrive at the initial DC inductance factor. The inductance ratio (65), resistance ratio (66), and ratio constant (64), therefore, define the relationship between the inductors 1 through 4 and the resistors 11 through 14 in the frequency dependent lossy line subcircuit element. An initial setting for inductive values of inductors 1 through 4 is calculated by multiplying the base line inductance (69) by respective inductance factors (65) to arrive at values for respective inductors 1 through 4. In all calculator iterations, the calculator is set for a maximum of 10,000 iterations, a precision $10^{-12}$ and an accuracy of 0.1 percent which define the limits of the solver.

An initialization of the calculator uses the input data to calculate initial values for $R_{DC}$, first, second and third frequency resistors (11–14) based upon the effective DC resistance of the parallel combination of $R_{DC}$ (11) through $R_{f5}$ (14) and the relationship therebetween as defined by the resistance factors (66a–66c). The initial resistive values are calculated using conventional parallel resistive equations solving for $R_{DC}$ and thereafter solving for the first, second, and third frequency resistor values by their relationship to $R_{DC}$ through the resistance factors (66a–66c). Initial inductor values are similarly calculated.

Figure 6:
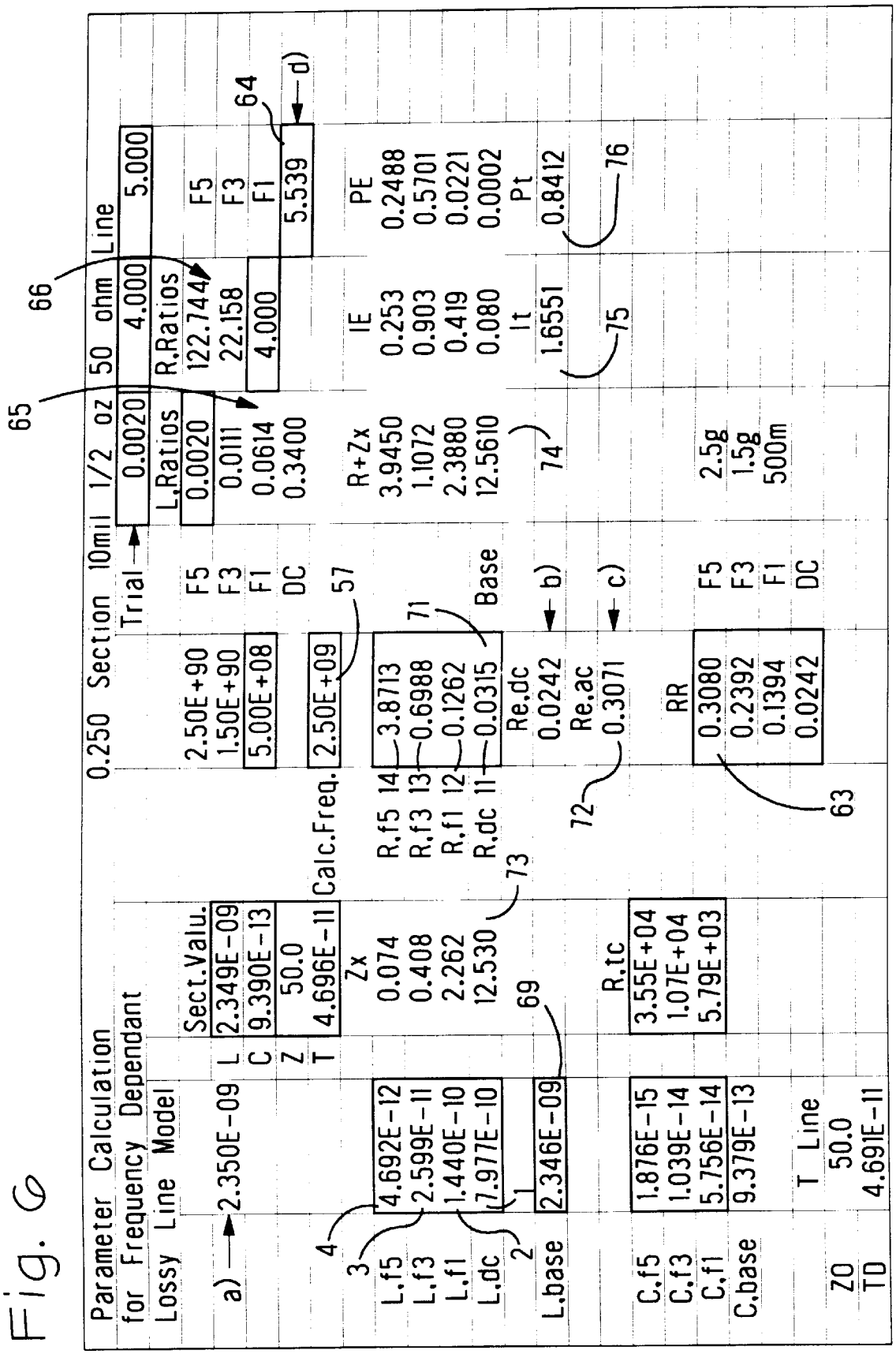
FIG. 6 illustrates a second iteration of the circuit element solver.

In a first refinement of the calculator and with specific reference to FIG. 6 of the drawing, a calculation is made based upon a maximum frequency of interest which in the present example is 2.5 Ghz. The frequency of interest is input into the working frequency field (57). The solver is instructed to change the ratio constant (64), the baseline inductance (69) and the baseline resistance (71) until an effective AC resistance (72) is equal to the target effective resistance (63) at the fifth harmonic frequency. Specifically, the ratio constant (64) is modified. The inductance and resistance ratios (65,66) are recalculated from the new ratio constant (64) according to the same relationships for the first refinement. With the resistance and inductance ratio (65,66) modified, the baseline inductance (69) and a baseline resistance (71) are also modified. From the baseline values (69,71), the values of inductors (1–4) and resistors (11–14) are recalculated as a function of the resistance and inductance ratio (65,66). Based on the recalculated inductor (1 through 4) and resistor (11 through 14) values, an imaginary impedance component is calculated in a first intermediate impedance field (73). An impedance magnitude is then calculated for each series inductor/resistor combination in a second intermediate impedance field (74) using the equation R+Z$_x$=2πfL$_{fx}$. Based on a one volt excitation signal, the current through each series inductor/resistor combination is calculated using the general relationship V=I|Z|. The current through each series resistor/inductor combination is summed to arrive at the total current (I$_t$) (75). The power dissipated in each series resistor/inductor combination is calculated using the relationship P$_E$=I$_E^2$|Z|. The power dissipated in each series resistor/inductor combination is summed to arrive at the total power dissipated (P$_E$) (76). From the total power dissipated and total current through the array, the effective AC resistance may be calculated. The total power dissipated (76) is divided by the total current (75) to render the value for effective AC resistance (72) at the working frequency (57).

$$P_t(76) = \frac{R_{e,ac}(72)}{I_t^2(75)}$$

The calculated effective AC resistance (72) of the parallel combination subcircuit is compared to the target effective AC resistance (66) at the working frequency (57). If the calculated AC resistance (71) is within the precision of the effective AC resistance (63), the second refinement is complete. If the effective AC resistance (71) is not within the precision range, the ratio constant (64) is modified to calculate the inductance and resistance ratio (65,66) in order to recalculate and compare the calculated AC resistance (72) to the effective AC resistance (63) at the working frequency (57). The solver iterates until one of the iteration limits is satisfied. The result of the first refinement is an optimum ratio constant (64) for the model.

In a second refinement of the calculator and with specific reference to FIG. 7 of the drawings, the calculator utilizes a working frequency (57) corresponding to the first frequency. The first frequency in the present embodiment is the 500 hz fundamental frequency. The second refinement operates by modifying the resistance ratio (66a) at the working frequency. The remaining resistance ratios (66) are calculated from the multiplication of the modified resistance ratios (66a) and the ratio constant (64) derived from the first refinement. Calculations identical to those made in the first refinement are made in the second refinement calculate the impedance (73,74,) total current (75), and the total power dissipated (76) to arrive at the calculated AC resistance (72) at the working frequency (57). The calculated AC resistance (72) is compared to the effective AC resistance (63) at the working frequency (57). The resistance ratio (66a) is iteratively modified until the calculated AC resistance (72) and the effective AC resistance (63) are within the precision limits set for the solver calculator. The result of the second refinement is a set of optimized values for the resistor ratios (66).

In a third refinement of the calculator and with specific reference to FIG. 8 of the drawings, the calculator utilizes a working frequency (57) corresponding to a third frequency. The third frequency in the present embodiment is the fifth harmonic of the fundamental frequency with the value of 2.5 Ghz. The third refinement operates to modify the inductance ratio (65a) at the working frequency (57). The inductance ratio (65) for the remaining frequencies are calculated based upon the modified inductance ratio (65) at the working frequency (57) and the optimized ratio constant (64). From the recalculated inductance ratios (65), the value for inductors (1–4), the impedance of each series inductor (1–4)/ resistor (11–14) combination at the working frequency (57), the total current (75), the total power dissipated (76), and the calculated effective AC resistance (72) are solved as described hereinbefore. The calculated effective AC resistance (72) is compared against the target effective resistance (63) at the working frequency (57). The calculator iterates modifying the inductance ratio (65) until the calculated effective AC resistance (72) is within the preset precision limits of the target effective resistance (63). The result of the third refinement is an optimized inductance ratio (65a).

Upon completion of all the refinements, the value for the DC resistor through the third frequency resistor (11–14) and the DC inductor through the third frequency inductor (1–4) are optimized for the given target effective resistance (63), thereby defining that portion of the frequency dependent lossy line subcircuit. Values for a first, second, and third shunt capacitors (22–24) are calculated to match the input and output impedances at the first port (100) and the internal node (103) of the subcircuit to the desired characteristic impedance (56) of the frequency dependent lossy line when used in combination with the parallel resistor/inductor network. From the values from the first through third shunt capacitors (22–24), values for a first through third time constant resistor (32–34) are calculated to create three RC time constants at each of the first through third frequencies. The characteristic impedance (56) of the lossless transmission line element (35) is set to the desired characteristic impedance to match the subcircuit input/output impedance. In the present embodiment, the characteristic impedance is 50 ohms. A value for a transmission delay (77) for the lossless element (35) is set to the balance of the target delay (78) for the frequency dependent lossy line that is not accounted for by the delay already present in the subcircuit.

All necessary terms being calculated, the terms are then manually entered into a netlist (20) defining the frequency dependent lossy line element in the HSPICE® software format. With specific reference to FIG. 9 of the drawings, values for the DC inductor through the third inductor (1–4), DC resistor through the third resistor (11–14), first shunt capacitor through the third shunt capacitor (22–24), with first time constant resistor through the third time constant resistor (32–34), and the characteristic impedance (56) and transmission delay (77) of the lossy transmission element (35) are entered to define a circuit that is used to model a transmission line.

Use of the netlist (20) in a larger model of a circuit using HSPICE® software provides circuit simulations that more closely predict the actual performance of the transmission line than prior art models. Based upon the simulated performance of an electronic system being modeled, a circuit designs may make certain decisions about whether a proposed design is acceptable prior to fabrication and test of hardware. If the simulated performance is unacceptable, the design for the electronic system is modified to address area(s) of concern. Based upon the modified design, the circuit model is modified accordingly. A simulation is executed for the modified design and evaluated. The process of modifying the design and model and executing the circuit simulation continues interatively until the simulation results indicate acceptable predicted circuit performance. Upon indication of acceptable simulated circuit performance, the electronic system is fabricated with a higher degree of confidence in achieving acceptable actual circuit performance than in prior art processes using circuit simulation tools as a design aid.

Other advantages of the invention are apparent from the detailed description by word of example, and from accompanying drawings, and from the spirit and scope of the appended claims.

I claim:

1. A method for fabricating an interconnection path comprising the steps of:

providing a computer system for modeling performance of the interconnection path using a computer model, selecting a set of application specific parameters for the computer model, executing the computer model to simulate performance of said interconnection path in response to an excitation signal wherein the computer model comprises a subcircuit to simulate the interconnection path, the subcircuit comprising a dc resistance in series with a dc inductance, in parallel with a first frequency resistor in series with a first frequency inductor, said first frequency resistor and inductor series combination having a path to a reference point through a first frequency shunt capacitor, comparing the simulation results against operational performance targets, modifying the set of application specific parameters and repeating the step of executing the computer model if the simulated results are not optimal, fabricating the interconnection path according to an optimal one of said application specific parameter sets.

2. A method for fabricating an interconnection path as recited in claim 1 the computer model further comprising a second frequency resistor in series with a second frequency inductor in parallel with the first frequency resistor and inductor, said second frequency resistor and inductor series combination having a path to said reference point through a second frequency shunt capacitor.

3. A method for fabricating an interconnection path as recited in claim 2 the computer model further comprising a second frequency shunt resistor in series with the second frequency shunt capacitor.

4. A method for fabricating an interconnection path as recited in claim 2 the computer model further comprising a third frequency resistor in series with a third frequency inductor in parallel with the first frequency resistor and inductor, said third frequency resistor and inductor series combination having a path to said reference point through a third frequency shunt capacitor.

5. A method for fabricating an interconnection path as recited in claim 4 the computer model further comprising a third frequency shunt resistor in series with the third frequency shunt capacitor.

6. A method for fabricating an interconnection path as recited in claim 1 wherein the model further comprises a section delay element in series with said parallel combination network.

7. A method for fabricating an interconnect path based upon predicted frequency dependent performance of the interconnect path comprising the steps of:

selecting a material, cross sectional measurements, and a length for the interconnect path, selecting a first frequency, determining values for the effective DC and first frequency resistance and effective DC and first frequency inductance from known resistive and inductive values per unit length having the selected cross sectional measurements for the material selected and from the total length of the interconnect path, providing a computer model of at least a subcircuit representing the interconnect path, the subcircuit comprising a DC series combination of a DC resistance in series with a DC inductance, the DC series combination in parallel with a first frequency series combination of a first frequency resistance in series with a first frequency inductance, the first frequency series combination also including a first shunt path to a reference point through first frequency shunt capacitor, calculating a skin depth at the first frequency, determining values for the first frequency resistance and the first frequency inductance from known resistive and inductive values per unit length of the selected material having the cross sectional measurements, the calculated skin depth, and the length of the interconnect path, determining a value for the first shunt capacitor from known capacitive values per unit length having the selected material, the cross sectional measurements, and the length of the interconnect path, solving the computer model with the determined values to predict frequency dependent performance of the interconnect path, and fabricating the interconnection path according to the selected materials.

8. A method for fabricating an interconnect path as recited in claim 7 wherein the computer model further comprises a second frequency series combination in parallel with said DC and first frequency series combinations, the second series combination including a second shunt path to the reference point through second frequency shunt capacitor and further comprising the steps of:

selecting a second frequency, determining values for the effective second frequency resistance and effective second frequency inductance from the known resistive and inductive values per unit length of the selected material having the selected cross sectional measurements, the calculated skin depth, and the length of the interconnect path, determining a value for the second shunt capacitor from the known capacitive values per unit length of the selected material having the cross sectional measurements, and the length of the interconnect path.

9. A method for fabricating an interconnect path as recited in claim 8 wherein the computer model further comprises a third frequency series combination in parallel with said DC series combination, said first frequency series combination, and said second series combination, the third series combination also including a third shunt path to the reference point through third frequency shunt capacitor and further comprising the steps of:

selecting a third frequency, determining values for the effective third frequency resistance and effective third frequency inductance from the known resistive and inductive values per unit length of the selected material having the selected cross sectional measurements, the calculated skin depth, and the length of the interconnect path, determining a value for the third shunt capacitor from the known capacitive values per unit length of the selected material having the cross sectional measurements, and the length of the interconnect path.

10. A method for fabricating an interconnect path as recited in claim 7 wherein the interconnect path has a first port, a second port, and the step of determining values for said DC resistance, said DC inductance, said first frequency resistance and said first frequency inductance comprises the step of proportioning said values relative to each other so as to control the magnitude of the simulated current flow through the interconnect path as a function of the frequency content of an excitation signal presented at said first port.

11. A method for fabricating an interconnect path as recited in claim 7 wherein the step of determining values for said DC resistance, said DC inductance, said first frequency resistance, and said first frequency inductance further comprises selecting a DC to first frequency resistance ratio constant and a DC to first frequency inductance ratio constant and iteratively solving for said DC resistance and inductance and said first frequency resistance and inductance to fit circuit combination impedances to the predetermined effective DC resistance and inductance and effective first frequency resistance and inductance.

12. A method for fabricating an interconnect path as recited in claim 8 and further comprising the step of determining values for said DC, first frequency, and second frequency resistances and DC, first frequency, and second frequency inductances by identifying the effective DC, first, and second resistances and selecting DC, first frequency, and second frequency resistance ratio constants and DC, first frequency, and second frequency inductance ratio constants and iteratively solving for said DC, first frequency, and second frequency resistances and said DC, first frequency, and second frequency inductances to fit the circuit combination impedance to the predetermined effective DC, first, and second resistances and inductances based upon the DC, first frequency, and second frequency resistance and inductance ratios.

13. A method for fabricating an interconnect path as recited in claim 9 wherein the step of determining values for said DC resistance, said DC inductance, said first frequency resistance, and said first frequency inductance further comprises selecting a DC, first frequency, second frequency, and third frequency resistance ratio constant and a DC, first frequency, second frequency, and third frequency inductance ratio constant and iteratively solving for said DC resistance and inductance, said first frequency resistance and inductance, said second frequency resistance and inductance, and said third frequency resistance and inductance to fit the circuit combination impedance to the predetermined effective DC, first frequency, second frequency, and third frequency resistance and effective DC, first frequency, second frequency, and third frequency inductance.

14. A method for fabricating on interconnect path as recited in claim 7 wherein the known resistive value per unit length of the selected material comprises an effective DC resistance and an effective AC resistance, assumption that all conduction occurs within the AC resistance the calculated one skin depth and is uniformly distributed over the calculated one skin depth at the first frequency, and is multiplied by a factor of greater than or equal to one to account for resistive losses in a return plane.

15. A method for fabricating on interconnect path as recited in claim 8 wherein the known resistive value per unit length of the selected material comprises an effective DC resistance and an effective AC resistance, assumption that all conduction occurs within the AC resistance the calculated one skin depth and is uniformly distributed over the calculated one skin depth at the second frequency, and is multiplied by a factor of greater than or equal to one to account for resistive losses in a return plane.

16. A method for fabricating on interconnect path as recited in claim 9 wherein the known resistive value per unit length of the selected material comprises an effective DC resistance and an effective AC resistance, assumption that all conduction occurs within the AC resistance the calculated one skin depth and is uniformly distributed over the calculated one skin depth at the third frequency, and is multiplied by a factor of greater than or equal to one to account for resistive losses in a return plane.

* * * * *